United States Patent [19]

Tanabe et al.

[11] Patent Number: 5,370,299
[45] Date of Patent: Dec. 6, 1994

[54] BONDING TOOL HAVING DIAMOND HEAD AND METHOD OF MANUFACTURING THE SAME

[75] Inventors: Keiichiro Tanabe; Toshiya Takahashi; Akihiko Ikegaya; Naoji Fujimori, all of Hyogo, Japan

[73] Assignee: Sumitomo Electric Industries, Ltd., Osaka, Japan

[21] Appl. No.: 41,545

[22] Filed: Apr. 2, 1993

[30] Foreign Application Priority Data

| Apr. 23, 1992 | [JP] | Japan | 4-104809 |
| Apr. 23, 1992 | [JP] | Japan | 4-104810 |
| Apr. 23, 1992 | [JP] | Japan | 4-104811 |
| Apr. 28, 1992 | [JP] | Japan | 4-109955 |

[51] Int. Cl.$^5$ .................... B23K 20/02; H01L 21/58
[52] U.S. Cl. .................... 228/176; 228/44.7; 228/54
[58] Field of Search ............ 228/44.7, 54, 176; 427/590, 577; 156/612, DIG. 68

[56] References Cited

U.S. PATENT DOCUMENTS

| 4,836,881 | 6/1989 | Satoh et al. ............ 156/DIG. 68 |
| 4,859,531 | 8/1989 | Tsuji et al. ............ 428/333 |
| 4,932,582 | 6/1990 | Une ............ 228/54 X |
| 5,112,643 | 5/1992 | Ikegaya et al. ............ 423/446 X |
| 5,126,206 | 6/1992 | Garg et al. ............ 428/408 |
| 5,197,651 | 3/1993 | Nakamura et al. ............ 228/44.7 |
| 5,213,248 | 5/1993 | Horton et al. ............ 228/54 X |
| 5,264,071 | 11/1993 | Anthony et al. ............ 156/612 |

FOREIGN PATENT DOCUMENTS

| 0032437 | 7/1981 | European Pat. Off. . |
| 0254560 | 1/1988 | European Pat. Off. . |
| 0279898 | 8/1988 | European Pat. Off. . |
| 0435423 | 7/1991 | European Pat. Off. . |
| 0449571 | 10/1991 | European Pat. Off. . |
| 0487292 | 5/1992 | European Pat. Off. . |
| 64-5026 | 1/1989 | Japan . |
| 2-224349 | 9/1990 | Japan . |
| 25138 | 1/1992 | Japan ............ 228/54 |
| WO9114572 | 10/1991 | WIPO . |

*Primary Examiner*—Kenneth J. Ramsey
*Attorney, Agent, or Firm*—W. G. Fasse; W. F. Fasse

[57] ABSTRACT

A bonding tool has a head portion made essentially of vapor-deposited diamond, wherein a principal diamond crystal plane forming a head face is a (111) plane. Such a head face has high hardness and a good wear resistance. In order to improve the toughness of a bonding head which is mainly made of vapor-deposited diamond, a portion or ply forming the head face consists essentially of high-purity diamond, and another portion or ply supporting the head face consists essentially of low-purity diamond. The head face has a high rigidity, while the portion supporting the head face has a high toughness. In order to provide a bonding head portion which is mainly made of vapor-deposited diamond with electrical conductivity, a first portion or ply forming a head face consists essentially of polycrystalline diamond containing a relatively small amount of dopant, and another portion or ply supporting the first portion or ply contains a large amount of dopant. The head portion having electrical conductivity can be heated by energization. In a tool employing a coating containing vapor-deposited diamond as a bonding head portion, the coating is formed by a compound of a metal or ceramics and vapor-deposited diamond, in order to improve the strength of the coating and adhesion to a tool substrate.

10 Claims, 10 Drawing Sheets

BONDING TOOL HAVING DIAMOND HEAD AND METHOD OF MANUFACTURING THE SAME

FIELD OF THE INVENTION

The present invention relates to a TAB (tape automated bonding) type bonding tool which is employed for packaging a semiconductor device, and a method of manufacturing the same.

BACKGROUND INFORMATION

TAB system LSI packaging, which can cope with a reduction in the interconnection pitch as well as a reduction of the target apparatus in thickness and weight, has been increasingly employed for packaging LSI packages for example in a liquid crystal television, an electronic notebook, a laptop personal computer, a liquid crystal driver IC for a word processor, ICs for a watch and a hand-held calculator, and the like. The term TAB system refers to a method of batch-bonding a plurality of electrodes which are formed on an LSI chip with lead wires provided on a film carrier tape.

FIG. 1 typically illustrates LSI packaging in such a TAB system which is adapted to batch-bond hundreds of electrodes (Au) 2 which are provided on each LSI chip 1 at pitches of 70 to 200 μm with lead wires 4 which are formed on each film carrier tape 3 by etching with a bonding tool 10 which is heated to a temperature of 500° to 600° C. In such bonding, the bonding tool 10 presses the lead wires 4 against the electrodes 2 by a heated head face 10A. According to such a TAB system, it is possible to package a relatively large number of electrodes in a short time as compared with a system employing a wire bonding tool.

FIG. 2 illustrates the shape of a general bonding tool 20 which is employed in the TAB system. In this bonding tool 20, a head portion forming a head face 20A for bonding is supported by a shank 21 which is made essentially of a thermally unexpandable alloy. Such a bonding tool must have a high reliability for withstanding repeated use under a high temperature for a long time, and hence it is necessary to employ a material which is excellent in heat resistance and wear resistance particularly for the head portion.

In order to satisfy such requirement, the head of a conventional bonding tool is made of a synthetic or natural diamond single crystal, a binderless cBN sintered body or a diamond sintered body. However, a natural diamond single crystal has a large performance dispersion due to a large content of impurities, irregular crystal orientation and the like. Further, it is difficult to grow a large-sized single crystal of at least 7 to 8 mm square. A synthesized diamond single crystal, which is one of the materials having a most excellent performance, can be applied to only limited use since the same is extremely high-priced as compared with other materials. On the other hand, a binderless cBN sintered body is inferior in wear resistance to a material which is mainly composed of diamond. Further, a head face of a diamond sintered body cannot uniformly pressurize lead wires under a high temperature due to an extreme warp caused by a binder contained therein. Thus, none of the aforementioned materials is satisfactory for the user.

On the other hand, vapor-deposited polycrystalline diamond can sufficiently provide the required characteristics of diamond since the same contains no binder. Further, it is possible to reliably supply large-sized vapor-deposited diamond at a low cost. Thus, such vapor-deposited diamond has recently been employed as a material which is suitable for a bonding tool. For practical reasons vapor-deposited diamond is prepared by chemical vapor deposition (CVD) of decomposing and exciting a raw material gas which is mainly composed of hydrocarbon such as methane and hydrogen under a low pressure.

Japanese Patent Laying-Open No. 2-224349 (1990) in the name of the present assignee discloses vapor deposition of diamond on a base material of a sintered body essentially made of $Si_3N_4$, a sintered body essentially made of SiC, a sintered body essentially made of AlN, or Si, and brazing of the base material provided with such vapor-deposited diamond to a tool substrate essentially made of a metal. In a bonding tool according to this technique, a head portion essentially made of vapor-deposited diamond is connected to the tool substrate through the base material essentially made of the aforementioned sintered body or Si. Further, a head face for bonding is made of a (100) crystal plane and/or a (110) crystal plane of diamond.

Japanese Patent Laying-Open No. 64-5026 (1989) discloses a tool having a shank whose head portion is coated with vapor-deposited diamond. More specifically, the shank is essentially made of a stainless steel material, and diamond is deposited on its head portion by CVD in a thickness of about 5 μm. The foregoing literature discloses that tool warping due to a difference in the thermal expansion coefficients between the stainless steel material and the diamond, if the diamond coating exceeds 10 μm in thickness, remarkably reduces the bonding yield. The literature also discloses that durability of the tool is reduced if the diamond coating is not more than 1 μm in thickness.

In such a bonding tool, the head face is preferably as flat as possible. Immediately after vapor deposition, however, the diamond surface is so coarse that the same must be polished to define the head face. In order to facilitate such polishing, the diamond is so vapor-deposited that the (100) crystal plane and/or the (110) crystal plane thereof is oriented substantially in parallel with the head face surface. However, such a head face formed by the (100) plane and/or the (110) plane cannot be regarded as optimum with regard to the wear resistance of the bonding tool, although this orientation is preferable for the polishing. Thus, a bonding tool having a diamond head face which is flat and hard to wear is needed.

The above first mentioned literature discloses conventional bonding tools with a head portion which is essentially made of diamond having a thickness of 5 to 300 μm. The above further mentioned literature suggests a head portion which is essentially made of a diamond film having a thickness of 1 to 10 μm. The diamond forming such a head portion has a high purity. In general, high-purity diamond has a high rigidity.

Conventional bonding tools include a constant heating type tool and a pulse heating type tool. In the constant heating type tool having a heater which is mounted in a tool substrate, constant heat is transmitted from the heater to a head portion through the tool substrate. In the pulse heating type tool, on the other hand, a substrate consisting essentially of stainless steel, inconel or Mo is heated by instantaneous pulsed energization. The aforementioned conventional diamond bonding tool is suitable for constant heating but rather unsuitable for pulse heating, because a tool having a diamond head has an inferior thermal responsiveness compared to a tool made of a metal, since the diamond head face is heated by heat transmission from the tool substrate. In order to heat the head face of such a conventional diamond tool to a prescribed temperature in response to a current pulse and cool the same, a longer time is required as compared to a tool made of a metal. Thus, it is difficult to reduce a time required for single bonding. Thus, a diamond bonding tool suitable for pulse heating is desirable.

The tool having a shank whose head portion is coated with diamond can be manufactured through a small number of steps at a low cost. However, a vapor-deposited diamond film directly coating such a shank is inferior in adhesion strength to the shank.

Therefore, the conventional diamond-coated tool is inferior in durability since the diamond coating is easily separated or cracked during use. Thus, a diamond-coated tool which is superior in durability is desirable.

SUMMARY OF THE INVENTION

It is an object of the present invention to provide a bonding tool which is superior in wear resistance to the prior art.

Another object of the present invention is to make more detailed study as to the structure and composition of vapor-deposited diamond which is applied to a bonding tool, thereby providing a bonding tool which is improved to exhibit higher performance.

Still another object of the present invention is to provide a bonding tool, having a working surface made of vapor-deposited diamond, which has a higher thermal responsiveness than heretofore.

A further object of the present invention is to provide a bonding tool, having a head provided with a coating, which is superior in durability with substantially no separation or cracking caused in the coating.

According to one aspect of the present invention, a bonding tool comprises a bonding head portion having a head face for bonding and consisting essentially of vapor-deposited diamond, wherein a principal diamond crystal plane forming the head face is a (111) plane of polycrystalline diamond oriented substantially in parallel with the head face. Since the head face is preferentially occupied by the (111) plane, having the highest hardness in the diamond, this bonding tool has a bonding head which is hardly worn as compared with the prior art.

According to another aspect of the present invention, provided is a method of manufacturing a bonding tool having a head face which is mainly formed of a (111) diamond crystal plane. According to this method, first a base material having a backing surface for deposition of diamond is prepared. Then, diamond is deposited on this backing surface by vapor deposition to orient its (111) plane substantially in parallel with the backing surface, and thereafter a diamond layer is deposited thereon to orient a crystal plane having a lower hardness than the (111) plane. The base material or backing is brazed to a tool substrate so that the diamond layer defines a head face, and then the diamond layer having a lower hardness is removed by mirror polishing, to expose the (111) plane.

According to a further method of manufacturing a bonding tool having a head face which is mainly formed of a (111) diamond crystal plane, a base material having a mirror-finished surface is first prepared for deposition of diamond. Then, diamond is deposited on this mirror finished surface by vapor deposition to orient a (111) plane substantially in parallel with the base material mirror finished surface. The base material on which diamond is deposited is then separated or removed to obtain a diamond material, and the so-obtained diamond material is brazed to a tool substrate so that a surface, which has been in contact with the base material, defines a head face.

According to a further aspect of the present invention, a bonding tool of the invention comprises a bonding head section having a head face for bonding and consisting essentially of vapor-deposited diamond and a non-diamond component which is formed by vapor deposition of the diamond, wherein the bonding head section includes a first portion forming the head face and a second portion which is in contact with the first portion and contains a larger amount of the non-diamond component than the first portion. The non-diamond component may be amorphous carbon, graphite or glassy carbon. The second portion containing a larger amount of the non-diamond component is higher in tenacity and toughness than the diamond forming the head face, whereby the head face is supported by a material having high toughness.

According to a further aspect of the present invention, a bonding tool of the invention comprises a bonding head section having an electrical conductivity and consisting essentially of vapor-deposited polycrystalline diamond and a dopant, wherein the bonding head section includes a first portion forming a head face for bonding and a second portion which is in contact with the first portion and contains a larger amount of the dopant than the first portion. In this bonding tool, an element such as B, Al, P, Sb, Si, Li, S, Se, Cl, N, W, Ta, Re or Cr can be employed as the dopant or impurity. The diamond can be doped by the impurity during vapor deposition of the diamond. It is possible to directly heat the second head portion, which has an electrical conductivity or rather resistance due to the addition of the impurity, to heat the same by using its resistance.

According to a further aspect of the present invention, a bonding tool having a doped head portion consisting essentially of vapor-deposited diamond containing an impurity is produced by first preparing a base material having a surface for deposition of diamond and then depositing diamond on this prepared surface by vapor deposition with doping. Then, diamond is further deposited by vapor deposition but the supply of the impurity is omitted during the further deposition. Then, the base material is brazed to a tool substrate so that the deposited diamond defines a head portion, and a flat head face is formed by polishing.

According to a further aspect of the present invention, a bonding tool having a head portion which consists essentially of vapor-deposited diamond containing an impurity is made by first preparing a base material with a mirror-finished surface for deposition of diamond. Then, diamond is deposited on this mirror-finished surface by vapor deposition with doping, and thereafter the base material is separated or removed to obtain a diamond material. Then, the diamond material is brazed to a tool substrate so that a surface, which has been in contact with the base material, of the diamond material defines a head face. According to this method, the amount of impurity supply is reduced during a prescribed period at the beginning of the vapor deposition as compared with the impurity supply toward the end of the vapor deposition.

According to a further aspect of the present invention, a bonding tool comprises a bonding head portion partially coating a tool base material and consisting essentially of vapor-deposited diamond and at least either a metal or ceramics which has a thermal expansion coefficient closer to that of the tool substrate than the diamond, wherein the bonding head section has different diamond contents in a first portion forming a head face for bonding and a second portion providing adhesion strength to the substrate. The first portion forming a head face consists essentially of polycrystalline diamond, while the second portion providing adhesion strength to the substrate has a reduced diamond content and an increased content of at least either the metal or ceramics. The first portion forming a head face has an excellent heat resistance, wear resistance and chipping resistance, while the second adhesion portion bonding the head face to the tool substrate adheres to the substrate more strongly than the diamond, due to the addition of the metal or ceramics.

According to a further aspect of the present invention a bonding tool having a head portion containing a mixture of vapor-deposited diamond and a metal or ceramics is produced by first preparing a tool substrate having a surface for deposition of diamond, and then diamond is deposited on this surface by vapor deposition with a supply of powder of at least either a metal or ceramics which has a thermal expansion coefficient closer to that of the substrate than the diamond. Then, the supply of the metal or ceramics is stopped to continue only the vapor deposition of the diamond. Such a series of vapor deposition steps produces a bonding tool having a coating that serves as a bonding head portion.

The foregoing and other objects, features, aspects and advantages of the present invention will become more apparent from the following detailed description of the present invention when taken in conjunction with the accompanying drawings.

DESCRIPTION OF PREFERRED EMBODIMENTS AND OF THE BEST MODE OF THE INVENTION

Figure 1:
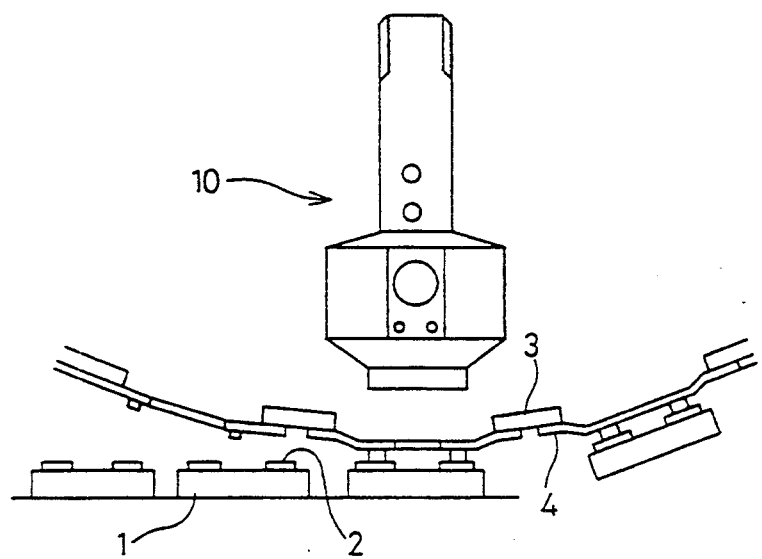
FIG. 1 is a model diagram for illustrating a TAB system.
Figure 2:
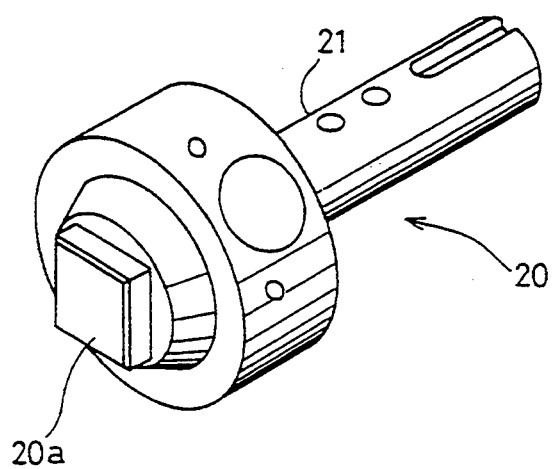
FIG. 2 is a perspective view showing the general shape of a bonding tool.

According to the present invention, diamond can be synthesized by various vapor deposition methods. For example, the vapor deposition methods can include CVD of decomposing and exciting a raw material gas using thermionic emission or plasma discharge, CVD employing a combustion flame, and the like. The raw material gas employed for such CVD can be prepared as a mixed gas mainly composed of hydrocarbon such as methane, ethane or propane, alcohol such as methanol or ethanol or an organic carbon compound such as ester, and hydrogen. In addition, the raw material may contain an inert gas such as argon, oxygen, carbon monoxide, water and the like in a range not inhibiting the synthesis of diamond and not adversely affecting the properties thereof.

The present bonding tool has a head surface formed mainly as a (111) diamond crystal plane. For this purpose a diamond head portion or section forming the (111) plane has a thickness or depth of up to about 10 $\mu$m and the (111) plane is preferably oriented substantially in parallel with the head face as a principal plane. It is preferable to suppress contamination by crystal planes other than the (111) plane to a minimum in the head portion or section having the above thickness of up to about 10 $\mu$m. Assuming that the (111) plane has an intensity of 100 by X-ray analysis in the Raman spectrum, for example, the (220), (311), (400) and (331) planes preferably have a respective intensity of not more than about 80, more preferably an intensity of not more than about 10 ($\lambda = 1.5450$ Å when CuK$\alpha_1$ is employed in a $2\theta-\theta$ method, for example). Further, in the vapor-deposited diamond layer forming the head face an FWHM (full width at half maximum intensity) value in a rocking curve of the (111) plane obtained by introducing X rays from the head face is preferably within about 20°, as an index showing the orientation of the (111) plane. On the other hand, the (220) plane preferably has an FWHM value of at least about 20° in such a rocking curve. In the bonding tool having the aforementioned features, the head face is preferably polished. For example, the head face preferably has surface roughness $R_{max}$ of not more than about 0.1 μm. The head face which is mainly formed by the (111) plane, having the highest hardness among diamond crystal planes, is hardly worn as compared with the (100) and (110) planes forming conventional head faces, whereby this bonding tool is superior in wear resistance to tools of the prior art. The entire diamond forming the head portion section may have a thickness of about 5 μm to 3 mm, preferably about 5 to 300 μm in which the portion forming the (111) plane has the above mentioned depth of up to about 10 μm.

Since a (111) plane is hard to polish, considerable devices have been required in order to obtain a practically flat head face which consists essentially of the (111) plane. The present invention has enabled implementation of a practical tool having a head face which is mainly formed of a (111) plane for the first time by the following two methods:

In the first method, a base material or backing having a surface for deposition of diamond is prepared first. The base material is preferably made of at least one material selected from the group consisting of a sintered body mainly composed of $Si_3N_4$, a sintered body mainly composed of SiC, a sintered body mainly composed of AlN, Si, and a combination thereof, for example. Such a base material has a particularly excellent adhesion strength to diamond. Then the diamond is deposited on the base material surface by vapor deposition to orient the (111) plane in parallel with the base material surface. The (111) plane can be generally formed by reducing the carbon concentration (with respect to gaseous hydrogen, for example) in the aforementioned CVD. The deposited diamond layer can be about 5 μm to 3 mm, preferably about 5 to 300 μm in thickness. Then, a diamond layer is further deposited on the vapor-deposited diamond to orient a crystal plane having a lower hardness than the (111) plane. The crystal plane having lower hardness than the (111) plane can be generally formed by increasing the carbon concentration (with respect to gaseous hydrogen, for example) in the aforementioned CVD. The crystal plane having a lower hardness is preferably deposited as a (220) plane, for example. The diamond layer having a low hardness is formed in a thickness of not more than about 50 μm, preferably about 10 μm, for example. Then, the base material or backing on which the diamond is deposited is brazed to a tool substrate. Such brazing is preferably carried out through a metallization layer consisting essentially of any metals included in the groups IVa, IVb, Va, Vb, VIa, VIb, VIIa and VIIb of the periodic table and compounds thereof. Then, the diamond layer having a low hardness is removed by mirror polishing, to expose the (11) plane. A head face obtained by such polishing preferably has a surface roughness $R_{max}$ of not more than about 0.1 μm, for example. Further, it is preferable to suppress the contamination of crystal planes other than the (111) plane to a minimum in the head face obtained after the mirror polishing and its proximity (up to about 10 μm in depth from the head face, for example). Assuming that the (111) plane has an intensity of 100 by X-ray analysis, for example, the (220), (311), (400) and (331) planes have preferably an intensity of not more than about 80, more preferably not more than about 10. When the diamond layer having a low hardness is removed to expose the (111) plane, it is possible to provide a head face having a high flatness, which is mainly formed by the (111) plane.

In the second method, a base material having a mirror-finished surface for deposition of diamond is prepared first. The surface of the base material is preferably mirror-finished to have a surface roughness $R_{max}$ of not more than about 10 μm, more preferably not more than about 0.2 μm. The base material is preferably made of Si or Mo, for example. Then, the base material on which the diamond is deposited is separated or removed to obtain a diamond material. The base material consisting essentially of Si or Mo can be separated or removed from the diamond deposited thereon by machining or chemical treatment. The so obtained diamond material is brazed to a tool substrate. After the brazing, the diamond surface having been in contact with the base material, i.e., a crystal growth start surface, defines a head face. Stated differently, a surface opposite to this surface, i.e., a crystal growth end surface, is employed as the brazing surface. This brazing surface is preferably provided with the aforementioned metallization layer prior to the brazing. The brazing can be effectively performed through such a metallization layer. According to this method, the surface, which has been in contact with the base material, of the diamond material obtained by separating or removing the base material is a mirror surface. This mirror surface may not need to be polished, or can be only simply polished, if necessary. The vapor deposition is so performed as to orient the (111) plane in parallel with the base substrate surface, whereby the surface of the diamond material having been in contact with the base material is substantially occupied by the (111) plane. When the diamond material is brazed to the tool substrate so that the surface having been in contact with the base material defines a head face, it is possible to obtain a bonding tool which is superior in wear resistance to the prior art. According to the aforementioned two methods, it is possible to provide practical bonding tools comprising head faces which are flat and mainly formed of (111) planes.

Figure 3:
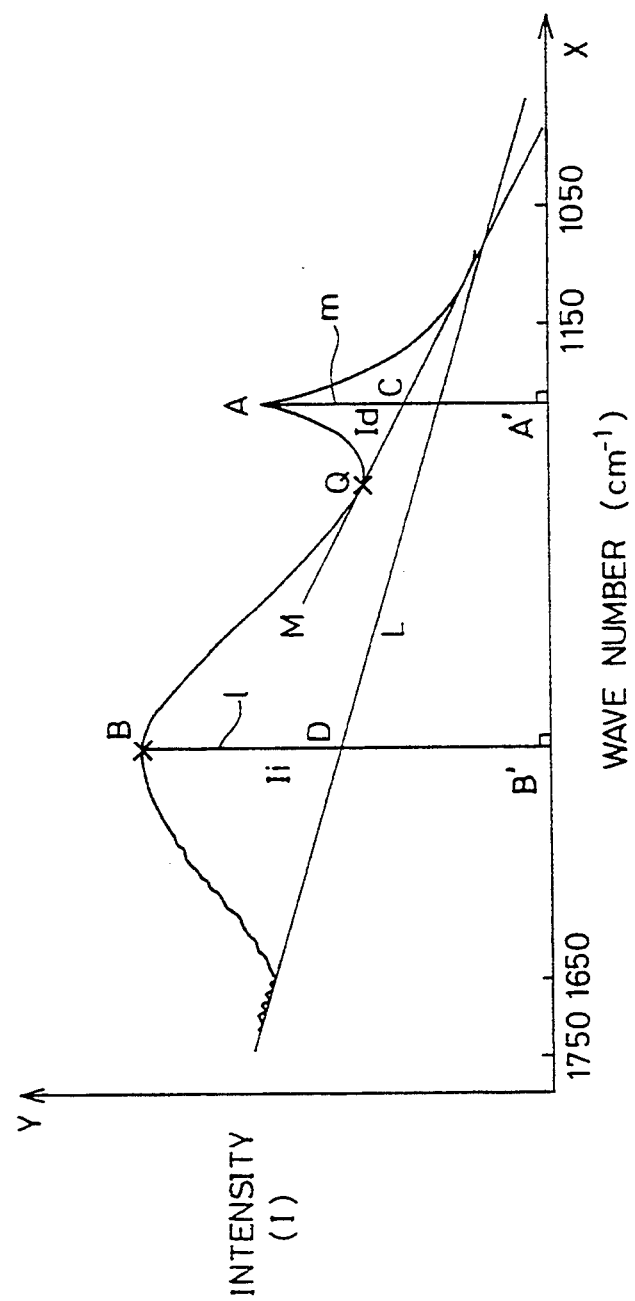
FIG. 3 illustrates a Raman spectrum for evaluating the content of a non-diamond component in the present bonding tool.

In a bonding tool containing a non-diamond component such as amorphous carbon, graphite or glassy carbon in its head face, the content of such a non-diamond component can be evaluated by Raman spectroscopic analysis in the following manner, for example. Referring to FIG. 3, showing the intensity (I) of a Raman spectrum obtained by Raman spectroscopic analysis. In this spectrum, a peak A appearing around 1332 $cm^{-1}$ is caused by diamond, and another peak B is caused by a non-diamond component such as amorphous carbon, for example. First, a background line L is drawn with respect to such a spectrum. Then, a minimum point Q between the peaks B and A is determined on the basis of the background line L. Then, a tangential line M is drawn through the point Q to a portion close to the base (1050 to 1150 $cm^{-1}$) to the right of the peak A. Assuming that point C represents the intersection of a perpendicular line AA' drawn from the peak A of the diamond toward the X-axis, the distance (m) between A and C shows the peak intensity (Id) of the diamond. Assuming that point D represents the intersection of another perpendicular line BB' drawn from the peak B of the non-diamond component toward the X-axis, on the other hand, the distance (l) between B and D shows the peak intensity (Ii) of the non-diamond component. It is possible to relatively evaluate the content of the non-diamond component by the ratio $Ii/Id$ of the peak intensity $Ii$ to $Id$ shown by the distances 1 and m. If the ratio $Ii/Id$ is reduced, the purity of the diamond is improved with a small content of the non-diamond component. If the ratio $Ii/Id$ is increased, the purity of the diamond is reduced with the increase in the content of the non-diamond component. In the bonding tool according to the present invention, therefore, the vapor-deposited diamond layer is so structured that the ratio $Ii/Id$ of the vapor-deposited diamond forming the head face is smaller than that of the subsequently formed diamond layers. According to the present invention, the vapor-deposited diamond forming the head face preferably has a ratio $Ii/Id$ of less than about 0.6, for example, and more preferably less than about 0.2. On the other hand, the diamond subsequently formed on the tool base material side preferably contains a larger amount of the non-diamond component, to have a larger ratio $Ii/Id$ as compared with the vapor-deposited diamond forming the head face. According to the present invention, the content of the non-diamond component can also be evaluated by an FWHM (full width at half maximum) value of the diamond peak in Raman spectroscopic analysis. In general, the peak is increased and the FWHM value is reduced as purity of the diamond is improved with complete crystals. In the bonding tool according to the present invention, the vapor-deposited diamond forming the head face is so formed that its FWHM value is smaller than that of the subsequently formed diamond. In Raman spectroscopic analysis, the vapor-deposited diamond forming the head face preferably has an FWHM value of less than about 10 cm$^{-1}$, for example. On the other hand, the subsequently formed vapor-deposited diamond containing a larger amount of the non-diamond component preferably has a larger FWHM value. In such a bonding tool, the high-purity diamond forming the head face preferably has a thickness of about 5 to 80% of that of the overall diamond, for example. On the other hand, the vapor-deposited diamond containing the non-diamond component, which is formed as a continuation of the high-purity diamond formation, preferably has a thickness of about 20 to 95% of that of the overall diamond thickness. The thickness of the overall diamond can be about 5 to 300 μm, for example. In this bonding tool, the vapor-deposited diamond can be formed on a base material made essentially of a sintered body which is mainly composed of $Si_3N_4$, Si or AlN, or Si, for example. The base material on which the diamond is deposited is brazed to a tool substrate. The brazing can be effectively performed through the aforementioned metallization layer. Alternatively, a head member made essentially of high-purity vapor-deposited diamond and vapor-deposited diamond containing a non-diamond component may be directly brazed to a tool substrate. The brazing can be effectively performed with the aid of a metallization layer which is formed on the head member. In such a bonding tool, the bonding head face is preferably polished. This head face preferably has a surface roughness $R_{max}$ of not more than about 0.1 μm, for example. High-purity vapor-deposited diamond which has generally been applied to a bonding tool has a high rigidity, while the same is not necessarily superior in toughness. In other words, high-purity vapor-deposited diamond which is synthesized under uniform conditions as a whole is relatively easily chipped by an external force. The present bonding tool has been proposed in order to avoid such a disadvantage. In this bonding tool, the vapor-deposited diamond containing a larger amount of a non-diamond component as compared with the head face, has a superior tenacity and toughness compared to that of the diamond forming the head face. Since the head face is supported by such tough vapor-deposited diamond, the diamond forming this head face is supplemented in toughness, to be hardly chipped. Such a structure reinforces the toughness while maintaining the high rigidity of the relatively pure diamond forming the head face. Thus, the head portion of the bonding tool has an excellent wear resistance and it is hard to chip.

The bonding tool whose head portion has an electrical conductivity due to doping can contain an impurity or dopant such as B, Al, P, Sb, Si, Li, S, Se, Cl, N, W, Ta, Re or Cr, for example. It is possible to form doped vapor-deposited diamond by adding a proper amount of an impurity gas or a gas containing an impurity to a raw material gas used in the vapor deposition of the diamond. Alternatively, such an impurity may be added to previously vapor-deposited diamond through well-known diffusion or ion implantation. While the electrical conductivity of such polycrystalline diamond containing an impurity varies with the type of the added impurity, the electrical conductivity is improved by increasing the content of the same impurity. In the bonding tool according to the present invention, however, the polycrystalline diamond having an electrical conductivity, preferably has a specific resistivity in a range of $10^{-5}$ to $10^5$ Ω·cm, and more preferably in a range of $10^{-3}$ to $10^3$ Ω·cm. If the specific resistivity is in excess of $10^5$ Ω·cm, it can be difficult to directly energize the polycrystalline diamond to obtain a resistance heating to a required temperature. If the specific resistivity is less than $10^{-5}$ Ω·cm, on the other hand, the strength of the diamond can be reduced although the heating is simplified. The impurity preferably has a small atomic radius, since the diamond has an extremely small interatomic distance with a lattice constant of 3.56672 Å. Metal elements have a remarkable influence on the wear resistance and practical flatness of the polycrystalline diamond. Such metal elements, generally having large atomic radii, hardly enter spaces in the lattice of the diamond or serve as substitutional elements, but segregate at the grain boundaries of the diamond to reduce its crystallinity. Therefore, the content of the metal elements is preferably minimized. From the aforementioned point of view, the impurity or dopant is preferably made of boron (B), in particular. The concentration of the impurity with respect to carbon forming the polycrystalline diamond, is preferably set in a range allowing the formation of a head face having an excellent wear resistance and flatness while maintaining the crystallinity of the polycrystalline diamond and providing for an electrical conductivity sufficient for heating the head by an electrical current. Further, the impurity concentration varies with the type of the impurity used. If boron is employed as the impurity, for example, its concentration with respect to carbon is preferably in a range of about 0.1 to 50000 p.p.m. If this concentration is less than about 0.1 p.p.m., the specific resistivity is excessively increased to disable heating by an electrical current. If the concentration is in excess of about 50000 p.p.m., on the other hand, the crystallinity of the diamond can deteriorate so that the graphite, amorphous carbon etc. are simultaneously deposited in a low-pressure vapor deposition. In this bonding tool, the portion forming the head face and having a low impurity concentration preferably has a thickness of about 2 to 80%, more preferably, about 5 to 30%, of that of the overall diamond thickness, for example. Preferably, the portion or section forming the head face should contain absolutely no impurity. However, the concentration distribution of the impurity may be continuously or gradually changed in a section of the diamond. When such concentration distribution is continuously changed, it is possible to increase the impurity concentration as the distance from the head face increases. The head face of the tool is preferably flattened to a minimum such that the head face preferably has a surface roughness $R_{max}$ of not more than about 0.1 μm, for example. The diamond forming the head portion or section has a thickness of about 5 to 3000 μm.

The polycrystalline diamond containing the impurity added thereto can be heated by an electrical current as mentioned. The diamond forming the head portion has a thickness of about 10 to several 100 μm with a small thermal capacity, and has large thermal conductivity of at least 10 W/cm·°C. When only the head portion formed by the diamond is heated by energization, it is possible to increase the temperature at the head face to a prescribed level in a shorter time as compared to the prior art. When the energization is stopped, on the other hand, it is possible to quickly reduce the temperature of the diamond. The present bonding tool whose head portion is made of diamond has such an electrical conductivity that it also has an excellent thermal responsiveness to energization whereby its working surface can be heated or cooled in a shorter time as compared with prior art heads. In this bonding tool, it is possible to reduce a time required for single bonding in a pulse heating type, thereby improving the production efficiency of bonding. In this bonding tool the impurity concentration of the portion forming the head face is kept low or zero compared with the impurity concentration of other portions. Therefore, the portion forming the head face has high strength and an excellent wear resistance. Further, the head face maintains its flatness under a high temperature due to the low impurity concentration. Although it is difficult to directly heat the head face by energization due to its low conductivity, the temperature at the head face can be controlled with an excellent thermal responsiveness by heating the portion having a high impurity concentration due to the high thermal conductivity of the doped diamond portion. Thus, the present bonding tool has an excellent thermal responsiveness with a high strength and flatness of the head face, as well as an excellent durability.

A bonding tool having a conductive head can be manufactured in the following two methods: In the first method, a base material or backing having a surface for deposition of diamond is prepared first. The base material is preferably made of a material consisting essentially of a sintered body mainly composed of $Si_3N_4$, SiC or AlN, Si, or a combination thereof. Such a material has an excellent adhesion strength particularly with respect to diamond. Then, diamond is deposited on the base material surface by vapor deposition with doping, and thereafter the diamond is further deposited by vapor deposition while suppressing the supply of an impurity to reduce or avoid doping. Finally, the diamond is deposited in a thickness of about 5 to 500 μm, for example. The impurity or dopant can be prepared from any of the aforementioned various elements, preferably from boron. In the aforementioned CVD, it is possible to add a proper amount of impurity to the raw material gas for doping the diamond with the impurity. Alternatively, the impurity may be added to previously deposited diamond by well-known diffusion or ion implantation. The amount of the added impurity may be continuously or gradually reduced. Then, the base material having the doped diamond deposited thereon is brazed to a tool substrate. Then, the head face is flattened by polishing, to obtain a bonding tool which is suitable for pulse heating, as described. The head face obtained by the polishing preferably has a surface roughness $R_{max}$ of not more than about 0.1 μm.

In the second method, a base material having a mirror-finished surface for deposition of diamond is prepared first. The base material is preferably prepared from Si or Mo. It is possible to mirror-finish the surface of the base material to have a surface roughness $R_{max}$ of not more than about 1 μm, preferably not more than about 0.2 μm. Then, diamond is deposited on the base material surface by vapor deposition with doping. The diamond is deposited in a thickness of about 200 to 300 μm, for example. In the doping, the amount of impurity supply is reduced during a prescribed period from the starting of the vapor deposition as compared with a later period. After completion of the vapor deposition, the base material is separated or removed to obtain a diamond material. Then, the diamond material is brazed to a tool substrate so that a surface having been in contact with the base material defines a head face. Namely, the diamond surface having been in contact with the base material, i.e., a crystal growth starting surface, defines the head face when the brazing is completed. Therefore, a surface opposite to this surface, i.e., a crystal growth end surface, is generally employed as a brazing surface. This brazing surface is preferably provided with the aforementioned metallization layer prior to the brazing. The brazing can be effectively performed with the aid of the metallization layer. According to this method, the diamond is deposited on the mirror-finished base material, whereby the diamond material obtained by separating or removing the base material, has a mirror surface on the side having been in contact with the base material. This surface need not be polished, or may be only slightly polished, if necessary. The initial amount of an impurity supply is suppressed as compared to that in the later stage of the vapor deposition, whereby the portion forming the surface of the diamond material having been in contact with the base material has an excellent strength and wear resistance, as described above. When the diamond material is so brazed to the substrate that this surface defines a head face, it is possible to provide a bonding tool having a head face with an excellent thermal responsiveness, wear resistance, and flatness.

In the bonding tool having a coating with an improved adhesion strength to the tool substrate, the coating can contain a metal such as Mo, W, Cr, Co, Ni or Fe, for example, or ceramics such as SiC, $Si_3N_4$, WC or BN, for example. The material contained in the portion that provides the required adhesion strength to the tool substrate, or a combination of such materials is preferably selected from metals and ceramics that enhance the adhesion to the diamond and the adhesion to the tool substrate, and which have a proper thermal expansion coefficient. As to the adhesion to the vapor-deposited diamond, SiC, $Si_3N_4$, WC, BN, Mo and W are preferable, and excellent in this order. As to the adhesion to the tool substrate, on the other hand, Mo, W, Cr, Co, Ni and Fe are preferable. In consideration of these points, a portion of the coating closer to the tool substrate can contain a larger amount of Mo, WC, Cr, Co, Ni or Fe, which is excellent in adhesion to the tool substrate, while another portion of the coating which is in contact with a portion containing a larger amount of diamond can contain a large amount of SiC, $Si_3N_4$, WC, BN, Mo or W, for example. In this bonding tool, the coating containing the vapor-deposited diamond can be about 5 to 10000 μm thick, more preferably about 200 to 1000 μm thick, for example. In the coating, the portion consisting essentially of the vapor-deposited diamond and forming the tool head face, can have a thickness of about 5 to 95%, more preferably about 20 to 60% of that of the overall diamond coating. On the other hand, the portion that provides the required adhesion to the tool substrate and which contains the metal or ceramics, preferably has a thickness of about 5 to 95%, more preferably about 40 to 80% of that of the overall coating. The coating can contain about 20 percent by volume of the metal or ceramics, for example.

The bonding tool having a head portion formed by a coating containing vapor-deposited diamond and a metal or ceramics can be manufactured in the following manner: First, a tool substrate is prepared to have a surface suitable for the coating. The tool substrate can be made of a material such as Mo, W, an Fe—Ni alloy such as invar, for example, an Fe—Ni—Co alloy such as super invar, for example, an Fe—Co—Cr alloy such as stainless invar, for example, an Fe—Pt alloy, an Fe—Pd alloy, covar (29% of Ni, 17% of Co and a residue of Fe), a Cu—W alloy, a WC—Co alloy, a WC—TiC—Co alloy, a W—Ni alloy or stainless steel, for example. Then, diamond is deposited on the prepared surface of the tool substrate by vapor deposition with a supply of powder of at least either a metal or ceramics which has a thermal expansion coefficient closer to the thermal expansion coefficient of the tool substrate than to that of the diamond. The powder of the metal or ceramics can have a particle diameter of about 0.1 to 300 μm, preferably about 0.2 to 60 μm. This powder can be supplied into a flow of a raw material gas employed for the vapor deposition of the diamond, to adhere onto the tool substrate with the diamond. At this time, the powder can be temporarily completely melted, semi-melted, or completely unmelted. Since a high-temperature plasma jet performing the vapor deposition has a temperature distribution, it is possible to easily adjust the state of the powder depending on a position of the temperature distribution supplied with the powder. It is also possible to control the powder state by varying the particle diameter of the powder, since its thermal capacity is varied with the particle diameter. The diamond coating can be formed with the supply of the powder by well-known CVD, for example, this coating is more preferably formed along a thermal spraying process employing high-temperature plasma CVD. According to this step, a layer containing the diamond and a metal or ceramics is formed. This layer is excellent in adhesion to the tool substrate, and avoids problems that can be caused by a difference between the thermal expansion coefficients of the diamond and the tool substrate. When the powder is supplied in an unmelted state, it is possible to grow the diamond from nuclei of the particles of the powder. In this case, the diamond serves as a binder in the layer containing a mixture of the diamond and the powder, with excellent adhesion therebetween. Then, the supply of metal or ceramics is stopped so that only the diamond is vapor-deposited.

After the diamond is deposited to a proper thickness, formation of the coating is completed. A portion consisting essentially of the diamond can form a head face which has an excellent heat resistance, wear resistance, and chipping resistance. According to the aforementioned series of steps, it is possible to produce a coating which is integrally formed by a composite layer and a diamond layer. This coating strongly adheres to the tool substrate, and has an excellent durability. The aforementioned steps are also useful for forming a tool comprising a coating which strongly adheres onto a curved surface of a tool substrate. Further, the aforementioned series of steps can be continuously carried out. For example, it is possible to complete a bonding tool having a coating defining a working surface for bonding which strongly adheres to a tool substrate by simply setting the tool substrate in a CVD apparatus and depositing diamond for a proper length of time. According to this process, it is possible to manufacture a bonding tool which has an excellent durability through simple steps at a low cost.

In the coating containing diamond and a metal or ceramics, the portion forming a head face consists essentially of vapor-deposited diamond and has an excellent heat resistance, wear resistance, and chipping resistance. This portion is bonded to the tool substrate through the portion containing a mixture of a metal or ceramics and diamond. The mixed portion adheres to the tool substrate more strongly than the pure diamond. Further, the vapor-deposited diamond contained in the mixed portion is integrally formed with the diamond defining the head face. In addition, the metal or ceramics contained in the mixed portion has a thermal expansion coefficient that is closer to that of the tool substrate than that of the diamond, whereby the portion containing the metal or ceramics and adhering to the tool substrate has a smaller internal stress, which is caused by a difference in the thermal expansion coefficients as compared with a conventional diamond-coated tool. The coating structure containing the metal or ceramics strongly adheres to the substrate thereby preventing the separation of the coating. By relieving internal stresses the coating is prevented from separation or cracking caused by thermal shock which occurs repeatedly when the tool is used for its intended purpose. Further, the portion containing the metal or ceramics improves toughness of the coating.

Examples of the present invention are now described.

EXAMPLE 1

A base material made essentially of an SiC sintered body having an edge of 20 mm and a thickness of 5 mm was prepared.

Diamond was deposited on the SiC base material in a thickness of about 100 μm by well-known thermal filament CVD using a tungsten wire of 0.5 mm in diameter and 100 mm in length as a filament under the following conditions:

Raw Material Gas (Flow Rate): $CH_4/H_2=1\%$, total flow rate of 1000 cc/min.
Gas Pressure: 80 Torr
Filament Temperature: 2200° C.
Filament-to-Substrate Distance: 5 mm
Substrate Temperature: 920° C.

As the result of X-ray analysis of the as-formed diamond, a peak intensity ratio I(111)/I(220) of a (111)

plane to a (220) plane was about 20, and it was recognized that a strong orientation was attained for the (111) plane. This (111) plane exhibited an FWHM value of about 6° in a rocking curve. On the other hand, the (220) plane exhibited an FWHM value of about 14° in a rocking curve.

Then, a thermal filament CVD was again performed under the following conditions, to further deposit a diamond layer on the as-formed polycrystalline diamond, to a thickness of about 40 $\mu$m:
　Raw Material Gas (Flow Rate): $CH_4/H_2=8\%$, total flow rate of 1000 cc/min.
　Gas Pressure: 80 Torr
　Filament Temperature: 2400° C.
　Filament-to-Substrate Distance: 5 mm
　Substrate Temperature: 920° C.

As the result of a further thin film X-ray analysis, the newly formed diamond layer exhibited a ratio I(111)/I(220) of about 0.4, and it was noted that the (220) plane was oriented substantially in parallel with the base material surface.

Figure 4A:
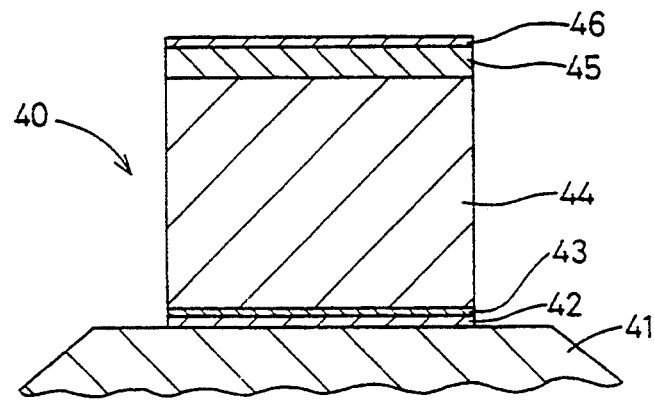
FIGS. 4A and 4B are sectional views schematically showing steps of manufacturing a bonding tool according to Example 1 of the present invention.
Figure 4B:
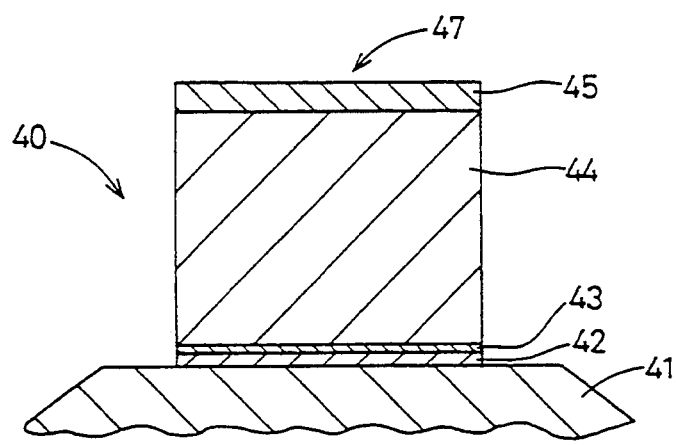

Then, a metallization layer 43 of Ti and Ni was directly vapor-deposited on another surface of the SiC base material 44, provided on one surface with the two diamond layers 45 and 46 which were vapor-deposited under the above different conditions. The thicknesses of the metallization layer was about 2 $\mu$m. Then the SiC substrate was vacuum-brazed to a shank 41 of stainless steel with silver solder 42 bonding to the metallization layer 43. FIG. 4A shows a bonding tool 40 in a state immediately after the brazing. The diamond layer 45 has a thickness of about 100 $\mu$m and forms a (111) plane. The diamond layer 46 has a thickness of about 40 $\mu$m and forms a (220) plane. After the layers 45 and 46 were successively deposited on the base material 44, the diamond layer 46 was removed by lapping. Due to such mirror polishing, it was possible to expose the (111) plane of the previously formed diamond layer 45 and to obtain a mirror finish surface for the layer 45 having surface roughness $R_{max}$ of about 0.1 $\mu$m. As the result of X-ray analysis performed on the as-obtained head face, a ratio I(111)/I(220) was about 15, and a principal diamond crystal plane forming the head face was the (111) plane. FIG. 4B shows a principal part of the bonding tool 40 obtained in the aforementioned manner. The layer 45 forms a flat head face 47 of the tool 40 and most of the head face surface is formed of the (111) plane.

Figure 5:
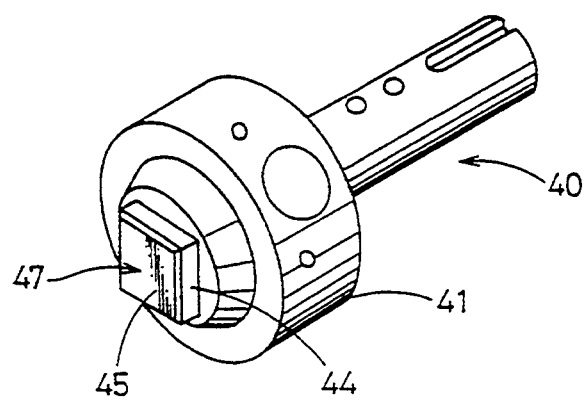
FIG. 5 is a perspective view showing the bonding tool manufactured according to Example 1 of the present invention.

FIG. 5 shows the overall shape of the bonding tool 40, in which the vapor-deposited diamond 45 is provided on the shank 41 through the SiC base material 44. The bonding tool 40 having the aforementioned structure was mounted on a bonding apparatus and subjected to an endurance test, whereby this tool withstood repeated applications 2,000,000 times.

EXAMPLE 2

An Si base material which was mirror-finished to have a surface roughness $R_{max}$ of not more than about 0.2 $\mu$m was employed to form a first polycrystalline diamond layer on the Si mirror surface. The first layer had a thickness of about 40 $\mu$m formed by the thermal filament CVD using a tungsten filament similar to that in Example 1 under the following conditions:
　Raw Material Gas (Flow Rate): $CH_4/H_2=1\%$, $O_2/CH_4=20\%$, total flow rate of 1000 cc/min.
　Gas Pressure: 60 Torr
　Filament Pressure: 2200° C.
　Filament-to-Substrate Distance: 7 mm
　Substrate Temperature: 880° C.

Then, a further thermal filament CVD was performed to form a second diamond layer under the following conditions on the as-formed polycrystalline first diamond layer. The second layer had a thickness of about 310 $\mu$m:
　Raw Material Gas (Flow Rate): $CH_4/H_2=12\%$, $CO_2/CH_4=10\%$, total flow rate of 1000 cc/min.
　Gas Pressure: 120 Torr
　Filament Temperature: 2400° C.
　Filament-to-Substrate Distance: 5 mm
　Substrate Temperature: 920° C.

As the result of X-ray analysis, the first prepared diamond layer exhibited a ratio I(111)/I(220) of about 40, and it was recognized that the (111) plane was oriented substantially in parallel to the base material surface in the first formed diamond layer. On the other hand, the second formed diamond layer exhibited a ratio I/(111)/I(220) of about 0.01, and it was found that the (220) plane was also oriented substantially in parallel with the base material surface.

Then, the Si base material, provided with the two diamond layers which were vapor-deposited under the different conditions set forth above, was dissolved and removed by fluoronitric acid to obtain a diamond material. On the as-obtained diamond material, Ti and Ni were successively stacked on the crystal growth end surface to a thickness of about 1 $\mu$m and about 2 $\mu$m respectively to form a metallization layer. Then the diamond material was vacuum-brazed to a shank of stainless steel with silver solder so that the surface provided with the metallization layer defined a joint surface. A head face opposite the brazing or bonding layer had surface roughness $R_{max}$ of about 0.1 $\mu$m.

Figure 6:
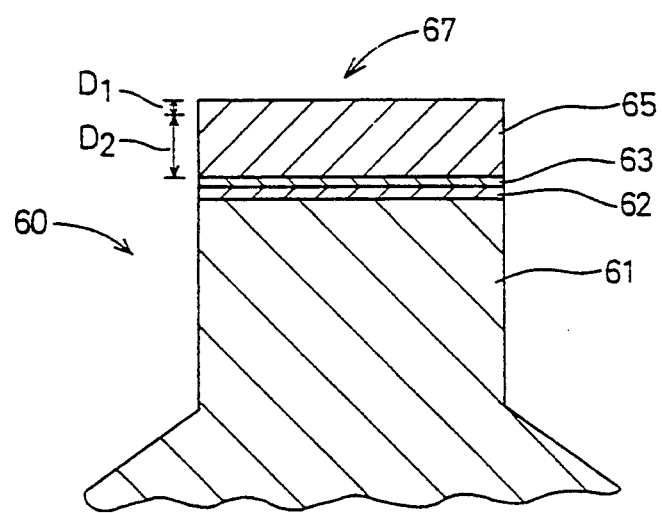
FIG. 6 is a sectional view schematically showing a bonding tool manufactured according to Example 2 of the present invention.

FIG. 6 shows a principal part of the bonding tool 60 having a diamond layer 65 brazed to a shank 61 of stainless steel by a brazing layer 62 and a metallization layer 63. In the diamond layer 65, a first ply $D_1$ of up to about 40 $\mu$m in depth or thickness from a head face 67 inwardly is occupied by diamond forming a (111) plane, while a second ply $D_2$ having a thickness or depth of about 40 $\mu$m up to about 350 $\mu$m is occupied by diamond forming a (220) plane. When the bonding tool having the aforementioned structure was mounted on a bonding apparatus and subjected to an endurance test, this bonding tool withstood 3,000,000 applications.

Comparative Example 1

The same SiC base material as that in Example 1 was employed and provided with a first polycrystalline diamond layer with a thickness about 100 $\mu$m by the aforementioned thermal filament CVD under the following conditions:
　Raw Material Gas (Flow Rate): $CH_4/H_2=2.5\%$, total flow rate of 1000 cc/min.
　Gas Pressure: 80 Torr
　Filament Temperature: 2100° C.
　Filament-to-Substrate Distance: 6 mm
　Substrate Temperature: 900° C.

Then, a further thermal filament CVD was performed under the following conditions to deposit a second diamond layer on the first polycrystalline diamond layer. The second layer had a thickness of about 40 $\mu$m:
　Raw Material Gas (Flow Rate): $CH_4/H_2=3.5\%$
　Gas Pressure: 80 Torr
　Filament Temperature: 2100° C.
　Filament-to-Substrate Distance: 6 mm Substrate Temperature: 920° C.

As the result of X-ray analysis, the first formed diamond layer exhibited a ratio I(111)/I(220) of about 0.10. On the other hand, the second formed diamond layer exhibited a ratio I(111)/I(220) of about 0.05. Thus, the (220) plane was strongly oriented in each diamond layer.

Ti and Ni were successively stacked on another surface of the SiC substrate, provided with the two diamond layers on a first surface which were vapor-deposited under the above different conditions. The Ti and Ni layers had a thickness of about 1 μm and about 2 μm respectively, and formed a metallization layer. Then the base material was vacuum-brazed to a shank of stainless steel with silver solder while employing the surface provided with the metallization layer as a joining surface. Thereafter the diamond surface was further polished to expose the surface of the first formed diamond layer, thereby preparing a bonding tool provided with a head face having a surface roughness $R_{max}$ of about 0.1 μm. The bonding tool having the aforementioned structure was mounted on a bonding apparatus and subjected to an endurance test, whereby cracking was caused in the diamond forming the bonding face and the SiC base material already after 50,000 use cycles.

EXAMPLE 3

A base material made of essentially an SiC sintered body of 25 mm$^2$ having a thickness of 5 mm was prepared.

A first diamond layer was deposited on the SiC base material to a thickness of about 200 μm by well-known thermal filament CVD using a linear tungsten filament of 0.5 mm in diameter and 100 mm in length as a thermionic emission material under the following conditions:

Raw Material Gas (Flow Rate): CH$_4$/H$_2$=3%, total flow rate of 2000 cc/min.
Gas Pressure: 80 Torr
Filament Temperature: 2250° C.
Filament-to-Substrate Distance: 5 mm
Substrate Temperature: 930° C.

The resulting vapor-deposited diamond exhibited a ratio Ii/Id of about 0.5 based on Raman spectroscopic analysis. Further, a peak of this diamond exhibited an FWHM value of about 14 cm$^{-1}$.

Then, another diamond layer was continuously deposited on the first diamond layer to a thickness of about 50 μm under conditions identical to the above except the raw material condition, which was changed from CH$_4$/H$_2$=3% to CH$_4$/H$_2$=0.5%. The second deposited diamond layer exhibited a ratio Ii/Id of about 0.05 based on Raman spectroscopic analysis. Further, a peak of this diamond exhibited an FWHM value of about 5.5 cm$^{-1}$.

Then, Ti and Ni were vapor-deposited on another surface of the SiC base material. The Ti ply and the Ni ply each had a thickness of about 2 μm, respectively, to form a metallization layer. Thereafter, the SiC base material was vacuum-brazed to a shank of stainless steel with silver solder where the metallization layer formed the bonding layer. Thereafter, the diamond surface was polished, to prepare a bonding tool having a surface roughness $R_{max}$ of not more than 0.1 μm.

Figure 7A:
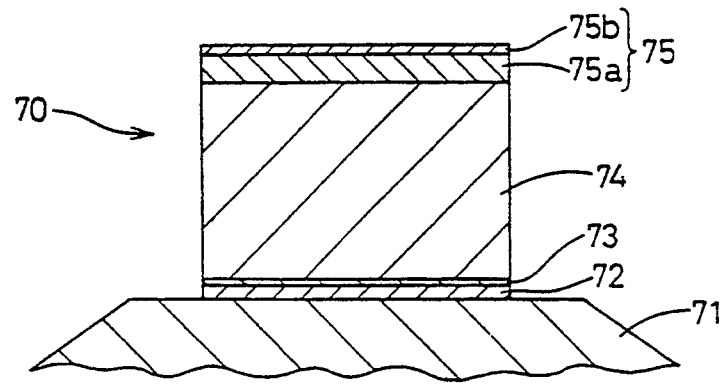
FIG. 7A is a sectional view showing a principal part of a bonding tool manufactured according to Example 3 of the present invention.
Figure 7B:
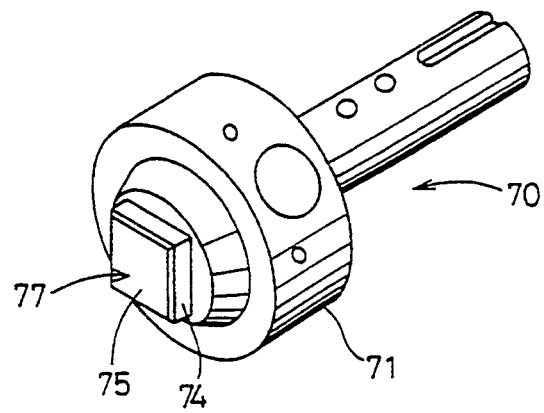
FIG. 7B is a perspective view showing the overall shape of the bonding tool manufactured according to Example 3 of the present invention.

FIGS. 7A and 7B show the as-obtained bonding tool 70 having an SiC base material 74 secured to a shank 71 of stainless steel through a brazing layer 72 and a metallization layer 73, as shown in FIG. 7A. Further, a coarse diamond layer 75a having a thickness of about 200 μm and a high-purity diamond layer 75b having a thickness of about 50 μm were successively deposited on the substrate 74. Referring to FIG. 7B showing the overall shape of the bonding tool 70, vapor-deposited diamond 75 is brazed to the shank 71 through the SiC base material 74. A head face 77 for bonding is formed of high-purity diamond. The bonding tool having the aforementioned structure was mounted on a bonding apparatus and subjected to an endurance test, whereby this bonding tool withstood 3,000,000 work cycles.

Comparative Example 2

The same SiC base material as that in Example 3 was employed to deposit diamond having a substantially homogeneous composition thereon and a thickness of about 300 μm under the following conditions:

Raw Material Gas (Flow Rate): CH$_2$/H$_2$=3%, total flow rate of 1500 cc/min.
Gas pressure: 60 Torr
Filament Temperature: 2100° C.
Filament-to-Substrate Distance: 5 mm
Substrate Temperature: 930° C.

The as-obtained vapor-deposited diamond exhibited a rate Ii/Id of about 1.2 according to Raman spectroscopic analysis, and a peak of this diamond exhibited an FWHM value of about 15.2 cm$^{-1}$.

Then, the base material was metallized similarly to Example 3, and thereafter brazed to a shank of stainless steel to prepare a bonding tool. The as-obtained tool was mounted on a bonding apparatus and subjected to an endurance test, whereby cracking was caused in the diamond forming a bonding face and the SiC base material at 50,000 work cycles.

EXAMPLE 4

An SiC base material of 25 mm$^2$ having a thickness of 5 mm, was mirror-finished to have surface roughness $R_{max}$ of not more than about 0.2 μm.

Polycrystalline diamond was deposited on the Si mirror surface to a thickness of about 50 μm by well-known thermal filament CVD using a tungsten filament of 0.5 mm in diameter and 100 mm in length under the following conditions:

Raw Material Gas: CH$_4$/H$_2$=0.8%, total flow rate of 2000 cc/min.
Gas Pressure: 80 Torr
Filament Temperature: 2200° C.
Filament-to-Substrate Distance: 5 mm
Substrate Temperature: 920° C.

The diamond formed under the above conditions exhibited a ratio Ii/Id of about 0.1 according to Raman Spectroscopic analysis, and its peak exhibited an FWHM value of about 5.4 cm$^{-1}$.

Then, vapor deposition of diamond was continuously performed under the same conditions as the above except the raw material gas condition, which was changed from CH$_4$/H$_2$=0.8% to CH$_4$/H$_2$=3.4%, to deposit diamond to a thickness of about 200 μm. The newly deposited diamond exhibited a ratio Ii/Id of about 0.34 and its peak exhibited an FWHM value of about 12.8 cm$^{-1}$.

Thereafter, the Si base material was dissolved and removed by fluoronitric acid, to obtain a diamond material. Ti and Ni were vapor-deposited on a vapor growth end surface of the as-obtained diamond material to a thickness of about 2 μm respectively to form a metallization layer. Thereafter, the diamond material was vacuum-brazed to a shank of stainless steel with silver solder through the metallization layer. A surface of the diamond material having been in contact with the Si base material defined a head face of the bonding tool.

Figure 8:
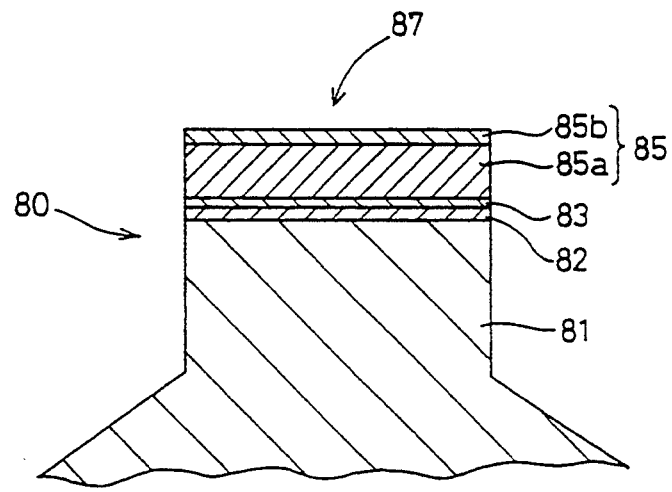
FIG. 8 is a sectional view showing a principal part of a bonding tool manufactured according to Example 4 of the present invention.

FIG. 8 shows a bonding tool 80 obtained in the aforementioned manner, wherein a diamond material 85 is bonded to a shank 81 of stainless steel through a brazing layer 82 and a metallization layer 83. In the diamond layer 85, a high-purity diamond ply 85b forming a head face 87 is supported by a coarse diamond ply 85a containing a large amount of a non-diamond component. The bonding tool having the aforementioned structure was mounted on a bonding apparatus and subjected to an endurance test, whereby this diamond tool withstood 3,500,000 work cycles.

Comparative Example 3

The same Si base material as that in Example 4 was employed to deposit diamond having a substantially homogeneous composition and a thickness of about 400 μm under the following conditions:
Raw Material Gas: $CH_4/H_2 = 2\%$, total flow rate of 3000 cc/min.
Gas Pressure: 50 Torr
Filament Temperature: 2200° C.
Filament-to-Substrate Distance: 5 mm
Substrate Temperature: 930° C.

The as-obtained vapor-deposited diamond exhibited a ratio Ii/Id of about 1.5 according to Raman spectroscopic analysis, and its peak exhibited an FWHM value of about 18.2 $cm^{-1}$.

Then, the base material was removed by fluoronitric acid similarly to Example 4, and the as-obtained diamond material was subjected to metallization and brazed to a shank of stainless steel to prepare a bonding tool. The as-obtained bonding tool was mounted on a bonding apparatus and subjected to an endurance test, whereby cracking was caused in the diamond forming a bonding face upon 60,000 work cycles.

EXAMPLE 5

A base material made essentially of an SiC sintered body having a length of 25 mm, a width of 1.3 mm and a thickness of 2 mm was prepared.

Diamond was deposited on one surface of the SiC base material to a thickness of about 200 μm with doping by well-known thermal filament CVD using a tungsten wire of 0.5 mm in diameter and 100 mm in length, as a filament under the following conditions:
Raw Material Gas (Flow Rate): $CH_4/H_2 = 1.5\%$, total flow rate of 1000 sccm
Gas Pressure: 80 Torr
Impurity Gas: $B_2H_6$
Impurity Concentration Range: B/C=0 to 700 p.p.m.
Filament Temperature: 2200° C.
Filament-to-Substrate Distance: 5 mm
Substrate Temperature: 920° C.

Figure 9:
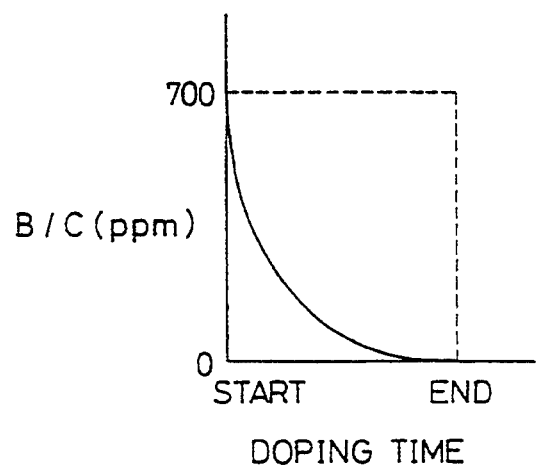
FIG. 9 shows the time dependent change in concentration of an impurity added in Example 5 of the present invention.

Under the above conditions, the impurity concentration (concentration of boron contained in the raw material gas with respect to carbon) was exponentially reduced from 700 p.p.m. to 0 p.p.m. from start to end of the vapor deposition, as shown in FIG. 9.

Then, Ti and Ni were vapor-deposited on another surface of the SiC base material. The Ti and Ni plies each had a thickness of about 2 μm, respectively, to form a metallization layer. Thereafter, the SiC base material was vacuum-brazed to a shank of Mo with silver solder through the metallization layer. Thereafter the surface of the vapor-deposited diamond was lapped to form a mirror surface having a surface roughness $R_{max}$ of about 0.1 μm.

Figure 10:
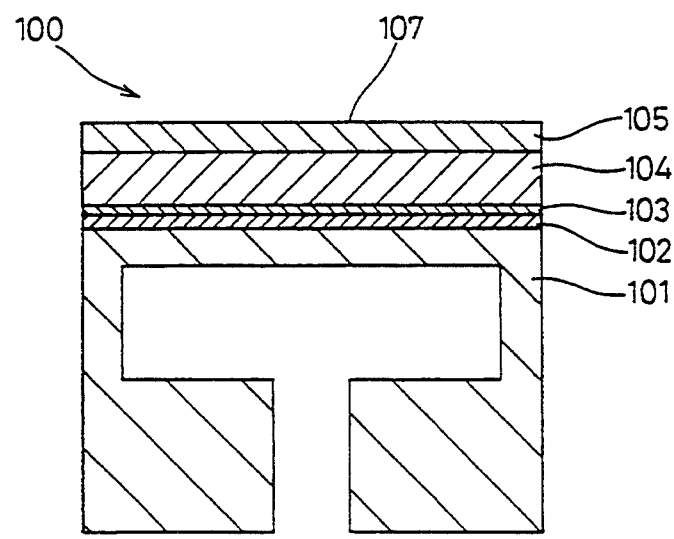
FIG. 10 is a sectional view schematically showing a bonding tool manufactured according to Example 5 of the present invention.
Figure 11:
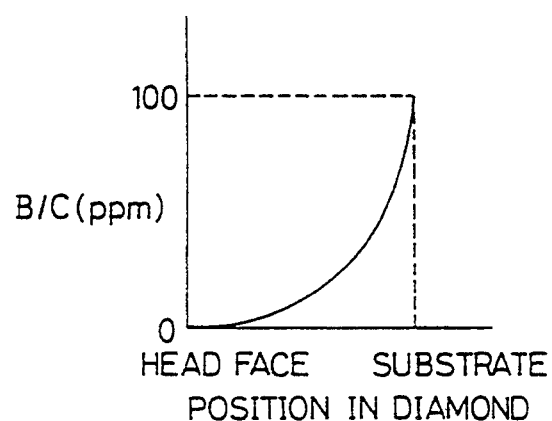
FIG. 11 shows an impurity distribution in the bonding tool according to Example 5 of the present invention.

FIG. 10 shows a principal part of the as-obtained bonding tool 100. In this bonding tool 100, an SiC base material 104 is secured to a shank 101 of Mo through a brazing layer 102 and a metallization layer 103. Diamond 105 is deposited on the base material 104 to a thickness of about 200 μm. A head face 107 consisting essentially of diamond is finished to form a mirror surface having a surface roughness $R_{max}$ of about 0.1 μm. On the other hand, the concentration (B/C) of boron to carbon is continuously changed in the diamond 105 as shown in FIG. 11. The concentration B/C is 0 p.p.m. in the head face, and 100 p.p.m. in a joint portion with the SiC base material, as shown in FIG. 11. The concentration B/C is exponentially increased from 0 to 100 p.p.m. in the diamond 105.

EXAMPLE 6

An Si base material which was mirror-finished to have a surface roughness $R_{max}$ of not more than about 0.2 μm was employed to form polycrystalline diamond on this mirror surface to a thickness of about 230 μm, by thermal filament CVD using a tungsten filament similar to that in Example 5 with doping, under the following conditions:
Raw Material Gas (Flow Rate): $CH_4/H_2 = 1\%$, total flow rate of 3000 cc/min.
Gas Pressure: 80 Torr
Impurity Gas: $B_2H_6$
Impurity Concentration Range: 0 to 1000 p.p.m.
Filament Temperature: 2180° C.
Filament-to-Substrate Distance: 7 mm
Substrate Temperature: 860° C.

Figure 12:
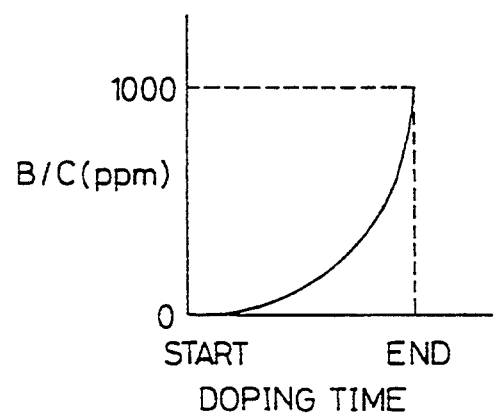
FIG. 12 illustrates the time dependent change in concentration of an impurity added in Example 6 of the present invention.

Under the above conditions, the concentration of the impurity added to the raw material gas was exponentially increased from start to finish of the vapor deposition as shown in FIG. 12.

Figure 13:
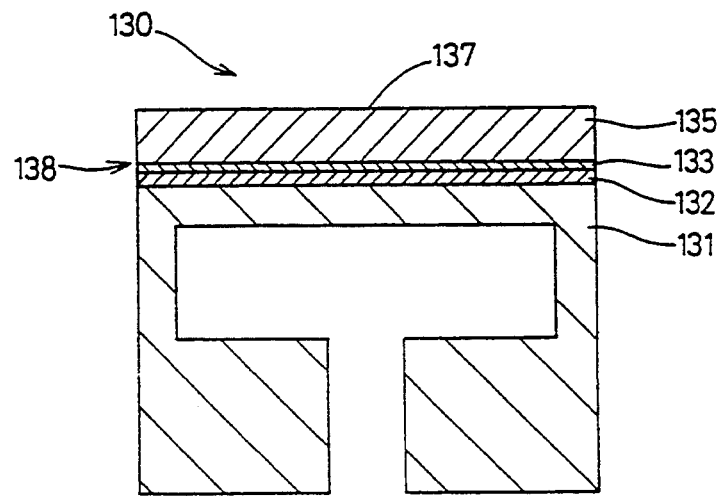
FIG. 13 is a sectional view schematically showing a bonding tool manufactured according to Example 6 of the present invention.
Figure 14:
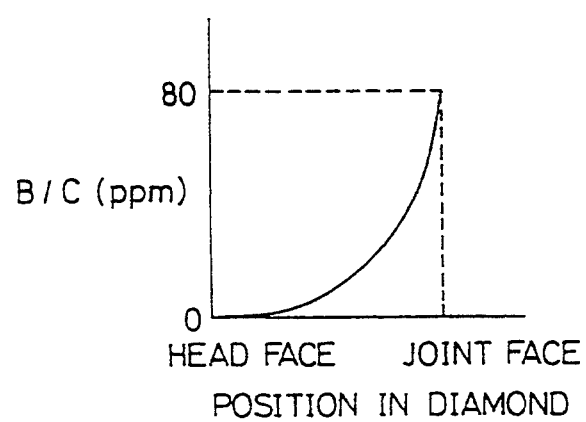
FIG. 14 shows a distribution of an impurity concentration in the bonding tool according to Example 6 of the present invention.

Then, the Si substrate, having the diamond vapor-deposited thereon, was dissolved and removed by fluoronitric acid, to obtain a diamond material. Ti and Ni plies were stacked on a crystal growth end surface of the diamond material to thicknesses of about 1 μm and about 2 μm, respectively, to form a metallization layer. Thereafter the diamond material was vacuum-brazed to a shank of an invar alloy with silver solder so that a surface provided with the metallization layer defined a joint surface. A head face obtained after the brazing had surface roughness $R_{max}$ of about 0.1 μm. FIG. 13 shows a principal part of the just described bonding tool 130. In this bonding tool 130, the diamond material 135 is secured on a shank 131 of an invar alloy through the brazing layer 132 and the metallization layer 133. FIG. 14 shows the distribution of impurity concentration (B/C) in a portion of the diamond material 135 from a head face 137 to a joint surface 138.

Comparative Example 4

The same SiC base material as that in Example 5 was employed to form polycrystalline diamond thereon to a thickness of about 200 μm with doping by the aforementioned thermal filament CVD under the following conditions:
Raw Material Gas (Flow Rate): $CH_4/H_2 = 2\%$, total flow rate of 1000 cc/min.
Gas Pressure: 60 Torr Impurity Gas: $B_2H_6$
Impurity Concentration: 8000 p.p.m.
Filament Temperature: 2400° C.
Filament-to-Substrate Distance: 10 mm
Substrate Temperature: 930° C.

Under the aforementioned conditions, the impurity was added as a constant amount from start to finish of the vapor deposition.

Figure 15:
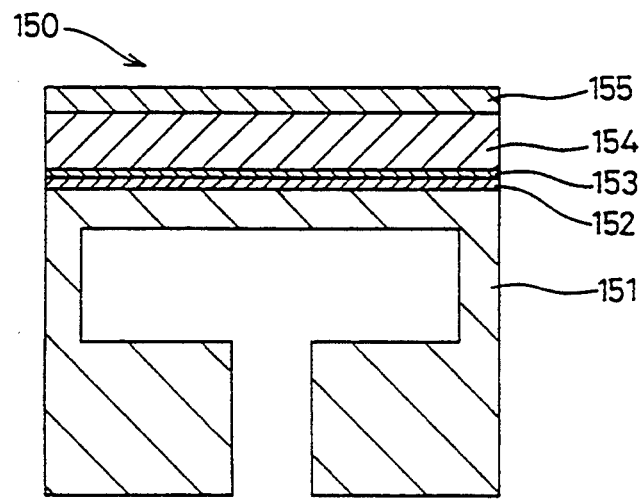
FIG. 15 is a sectional view schematically showing a bonding tool manufactured according to Comparative Example 4.

Ti and Ni were successively stacked on another surface of the SiC base material. The Ti and Ni plies had a thickness of about 1 μm and about 2 μm, respectively, to form a metallization layer. Thereafter the base material was vacuum-brazed to a shank of Mo with silver solder so that a surface provided with the metallization layer defined a joint surface. Then the diamond surface was polished to prepare a bonding tool provided with a head face having a surface roughness $R_{max}$ of about 0.1 μm. FIG. 15 shows a bonding tool 150 obtained in the aforementioned manner. In this bonding tool 150, an SiC base material 154 is secured on a shank 151 through a brazing layer 152 and a metallization layer 153. Diamond layer 155 containing boron in a homogeneous concentration over the entire diamond layer 155 is deposited on the base material 154 to a thickness of about 200 μm.

Comparative Example 5

A bonding tool consisting essentially of Mo was prepared to have the same dimensions and shape as those of the aforementioned bonding tool.

In testing Examples 5 and 6 and the Comparative Example 4, the diamond portions were energized, more specifically heated, and the durations for heating the head faces to 400° C. were measured. In Comparative Example 5, the Mo shank was heated for measuring a time required for heating the head face to 420° C.

As to the tools according to these Examples and Comparative Examples, the times required for reducing the temperatures at the head faces from 420° C. to 200° C. by air cooling were measured. Further, the temperature dispersion on the head faces heated for prescribed times to reach 420° C. was observed. Table 1 shows the results. The temperatures at the head faces were measured with an infrared thermometer.

TABLE 1

|  | Time required for Heating up to 420° C. (sec.) | Time required for Cooling from 420° C. to 200° C. (sec.) | Temperature Dispersion (°C.) |
|---|---|---|---|
| Example 5 | 0.4 | 1.5 | 6 |
| Example 6 | 0.2 | 0.9 | 3 |
| Comparative Example 4 | 1.2 | 2.0 | 10 |
| Comparative Example 5 | 1.8 | 3.5 | 60 |

The bonding tools according to these Examples and Comparative Examples were mounted on a bonding apparatus and subjected to endurance tests. The results are shown in Table 2. In the endurance tests, the bonding tools were used to repeatedly bond ICs each having 1000 pins with head face temperatures of 420° C. and bonding times of 0.2 seconds respectively.

TABLE 2

|  | Bonding | State of Wear |
|---|---|---|
| Example 5 | 3,000,000 times | $R_{max}$ of head face: 0.18 μm |
| Example 6 | 4,000,000 times | $R_{max}$ of head face: 0.21 μm |

TABLE 2-continued

|  | Bonding | State of Wear |
|---|---|---|
| Comparative Example 4 | 400,000 times | Rendered unusable with $R_{max}$ of head face reaching 30 μm |
| Comparative Example 5 | 10,000 times | Rendered unusable due to partial wear and warp of 20 μm/10 mm |

It is understood from the results shown in Tables 1 and 2 that the present bonding tools are superior in thermal responsiveness to the comparative bonding tools, and excellent in durability. On the other hand, the bonding tool according to Comparative Example 4 obtained by homogeneously adding boron to diamond is inferior in wear resistance and durability, although the same has an excellent thermal responsiveness.

EXAMPLE 7

Figure 16:
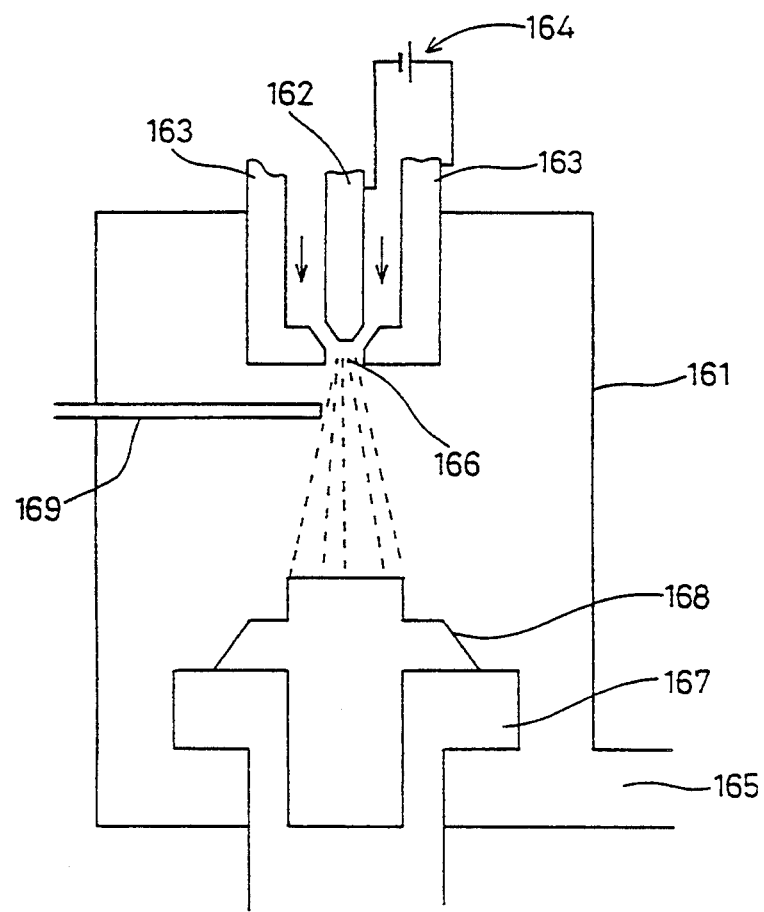
FIG. 16 is a model diagram showing an apparatus for manufacturing a bonding tool according to Example 7 of the present invention.

FIG. 16 shows an apparatus for forming a coating on a tool substrate, in order to manufacture a bonding tool according to the present invention. A method of manufacturing a bonding tool according to the present invention is now described with reference to FIG. 16.

The apparatus shown in FIG. 16, which is adapted to carry out high-temperature plasma CVD, has a vacuum chamber 161 which can be evacuated through an exhaust port 165. A cathode 162 and an anode 163 for discharge are provided in the upper section of the chamber. A power source 164 applies a dc voltage across the cathode 162 and the anode 163. A raw material gas for synthesizing diamond is supplied through the cathode 162 and the anode 163 as shown by arrows in FIG. 16. The gas is decomposed and excited by discharge at a supply port 166 therefor, to form a plasma. The pressure in the vacuum chamber 161 is reduced in a series of operations from the formation of the plasma to the formation of diamond. The as-formed plasma hits a surface of a shank 168 which is positioned to face the gas movement. The shank 168 is set in a holder 167, to grow diamond. When fine powder of a metal or ceramics is supplied onto the shank 168 through a pipe 169 simultaneously with the diamond growth, a layer containing a mixture of the metal or ceramics and the diamond is formed on the shank surface. At this time, the powder can be supplied to the base material surface in any one of the following states: melted, semi-melted, and unmelted. The states are obtained by adjusting the position of the pipe for supplying the powder. When the layer reaches a proper thickness, the supply of the metal or ceramics is stopped while the vapor deposition of the diamond continues, thereby depositing a diamond layer having a proper thickness. Thus formed is a coating having a head face which is formed at least by diamond and a portion adhering to the shank which contains a mixture of the metal or ceramics and the diamond.

The aforementioned apparatus was employed to form a diamond composite layer on a shank made essentially of Mo. The composite layer had a thickness of about 100 μm by well-known high-temperature plasma CVD under the following conditions:

Raw Material Gas (Flow Rate): $CH_4/H_2 = 2\%$, $Ar/H_2 = 100\%$, total flow rate of 3000 cc/min.
Pressure: 150 Torr
Substrate Temperature: 900° C.
Discharge Voltage: 60 V
Discharge Current: 60 A
Supplied Powder: SiC and Mo having a particle diameter of 20 to 30 μm.

Amount of Powder Supply: 1 g/min., 30 g total

At this time, the powder was supplied with Mo and SiC in melted and unmelted states, respectively.

Then, the supply of the powder was stopped and deposition of diamond continued to a thickness of about 200 μm under the above conditions. Thereafter the shank coated with the diamond was taken out of the apparatus and the diamond surface forming a head was lapped to form a head face having a surface roughness $R_{max}$ of about 0.1.

Figure 17A:
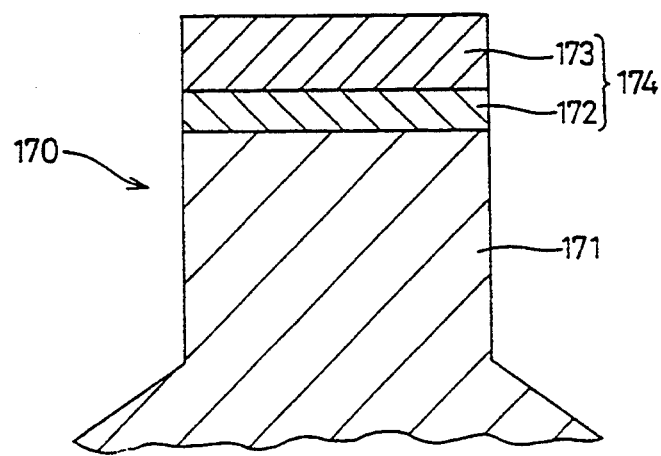
FIG. 17A is a sectional view showing a principal part of the bonding tool manufactured according to Example 7 of the present invention.
Figure 17B:
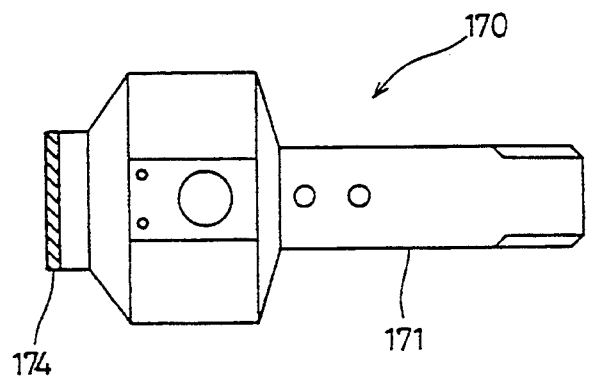
FIG. 17B is a side elevational view showing the overall shape of the bonding tool manufactured according to Example 7 of the present invention.

FIG. 17A shows a principal part of a bonding tool 170 formed in the aforementioned manner. In this bonding tool 170, a coating layer 174 including a diamond composite ply 172 containing SiC and Mo and a diamond ply 173 successively deposited thereon is formed on a shank 171. FIG. 17B shows the appearance of the overall shape of the bonding tool 170, in which the coating 174 is provided on a head of the integral shank 171 made essentially of Mo. The bonding tool having the aforementioned structure was mounted on a bonding apparatus and subjected to an endurance test, whereby this bonding tool withstood 1,200,000 work cycles.

Comparative Example 6

The same apparatus as described above was employed to form a diamond coating on a shank of the same material with no supply of powder under the following conditions:

Raw Material Gas (Flow Rate): $CH_4/H_2 = 3\%$, $Ar/H_2 = 100\%$, total flow rate of 3000 cc/min.
Pressure: 200 Torr
Substrate Temperature: 880° C.
Discharge Voltage: 70 V
Discharge Current: 62 A An attempt was made to form a diamond coating having a thickness of about 150 μm on the shank under the aforementioned conditions. The as-formed diamond layer was separated from the shank consisting essentially of Mo after completion of the coating.

According to the present invention, the material for the tool substrate can be prepared from W, another Fe—Ni alloy, an Fe—Ni—Co alloy such as super invar, for example an Fe—Co—Cr alloy such as stainless invar, for example an Fe—Pt alloy, an Fe—Pd alloy, covar (29% of Ni, 17% of Co and a residue of Fe), a Cu—W alloy, a WC—Co alloy, WC—TiC—Co alloy, a W—Ni alloy or the like, for example, in addition to the aforementioned materials employed in the Examples.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A bonding tool, comprising: a bonding head section consisting essentially of vapor-deposited polycrystalline diamond and having a head face for performing bonding work, and a substrate for holding said bonding head section, wherein a principal diamond crystal plane forming said head face is a (111) plane having an intensity of 100 by X-ray diffraction, and wherein further diamond planes are (220), (311), (400) and (331) planes having an intensity of not more than 80 by X-ray diffraction relative to said intensity of 100 of (111) plane in said bonding head section.

2. The bonding tool of claim 1, wherein said bonding head section has a thickness of at least about 10 μm.

3. The bonding tool of claim 2, wherein said (111) plane is oriented substantially in parallel to said head face in said bonding head section, said (111) plane being spaced from said head face at least about 10 μm in said bonding head section.

4. The bonding tool of claim 1, wherein said bonding head section is secured to said substrate through a base material comprising essentially a material selected from the group consisting of a sintered body mainly composed of $Si_3N_4$, a sintered body mainly composed of SiC, a sintered body mainly composed of AlN, and Si.

5. The bonding tool of claim 1, wherein said head section is brazed to said substrate.

6. The bonding tool of claim 1, wherein said head face has a surface roughness $R_{max}$ of not more than about 0.1 μm.

7. A bonding tool comprising a bonding head section consisting essentially of vapor-deposited polycrystalline diamond and having a head face for performing bonding work, a substrate for holding said bonding head section, wherein a principal diamond crystal plane forming said head face is a (111) plane, and wherein an FWHM value in a rocking curve of said (111) plane obtained by introducing X-rays into said bonding head section through said head face is within about 20°.

8. A bonding tool comprising a bonding head section consisting essentially of vapor-deposited polycrystalline diamond and having a head face for performing bonding work, a substrate for holding said bonding head section, wherein a principal diamond crystal plane forming said head face is a (111) plane, said bonding head section including at least one further plane which is a (220) plane, and wherein an FWHM value in a rocking curve of said (220) plane, obtained by introducing X-rays into said bonding head section through said head face is at least about 20°.

9. A method of manufacturing a bonding tool having a bonding head face, comprising the following steps:
    (a) preparing a base material to have a surface for deposition of diamond;
    (b) depositing a first diamond ply on said surface by vapor deposition to orient a (111) plane substantially in parallel with said surface;
    (c) further depositing on said first diamond ply a second diamond ply with a crystal plane orientation so that said second ply has a lower hardness than said (111) plane;
    (d) brazing said base material to a tool substrate so that said second diamond ply having a lower hardness covers said head face; and
    (e) removing said second diamond ply having said lower hardness by mirror polishing for exposing said (111) plane.

10. A method of manufacturing a bonding tool having a bonding head face, comprising the following steps:
    (a) preparing a base material having a mirror-finish surface for deposition of diamond;
    (b) depositing a diamond layer on said mirror-finish surface by vapor deposition to orient a (111) plane substantially in parallel with said mirror-finish surface;
    (c) separating or removing said base material from said diamond layer to obtain a diamond material layer; and
    (d) brazing said diamond layer to a tool substrate so that a surface of said diamond material having been in contact with said base material defines said bonding head face.

* * * * *